United States Patent [19]

Fisher et al.

[11] 4,153,882

[45] May 8, 1979

[54] HIGH-EFFICIENCY AMPLIFIER

[76] Inventors: Charles B. Fisher, 2850 Hill Park Rd., Montreal, Quebec, Canada, H3H 1T1; Sidney T. Fisher, 53 Morrison Ave., Montreal, Quebec, Canada, H3R 1K3

[21] Appl. No.: 889,897

[22] Filed: Mar. 24, 1978

[51] Int. Cl.² .............................................. H03F 3/38
[52] U.S. Cl. ...................................... 330/10; 328/14; 330/118
[58] Field of Search .................. 328/14; 330/10, 118; 333/6

[56] References Cited

U.S. PATENT DOCUMENTS

| 2,379,513 | 7/1945 | Fisher | 330/10 X |
| 3,931,581 | 1/1976 | Kush, Jr. et al. | 330/10 |

Primary Examiner—Lawrence J. Dahl

[57] ABSTRACT

This invention provides a method and means for amplifying signal waves with high efficiency that comprises signal sampling means operating at the Nyquist rate or greater, sample-quantizing means, a plurality of circuits that link the quantizing means to a plurality of controlled current-switching means, combining means that combines the outputs of the plurality of switching means, and filter means that reconstructs an amplified facsimile of the signal.

2 Claims, 1 Drawing Figure

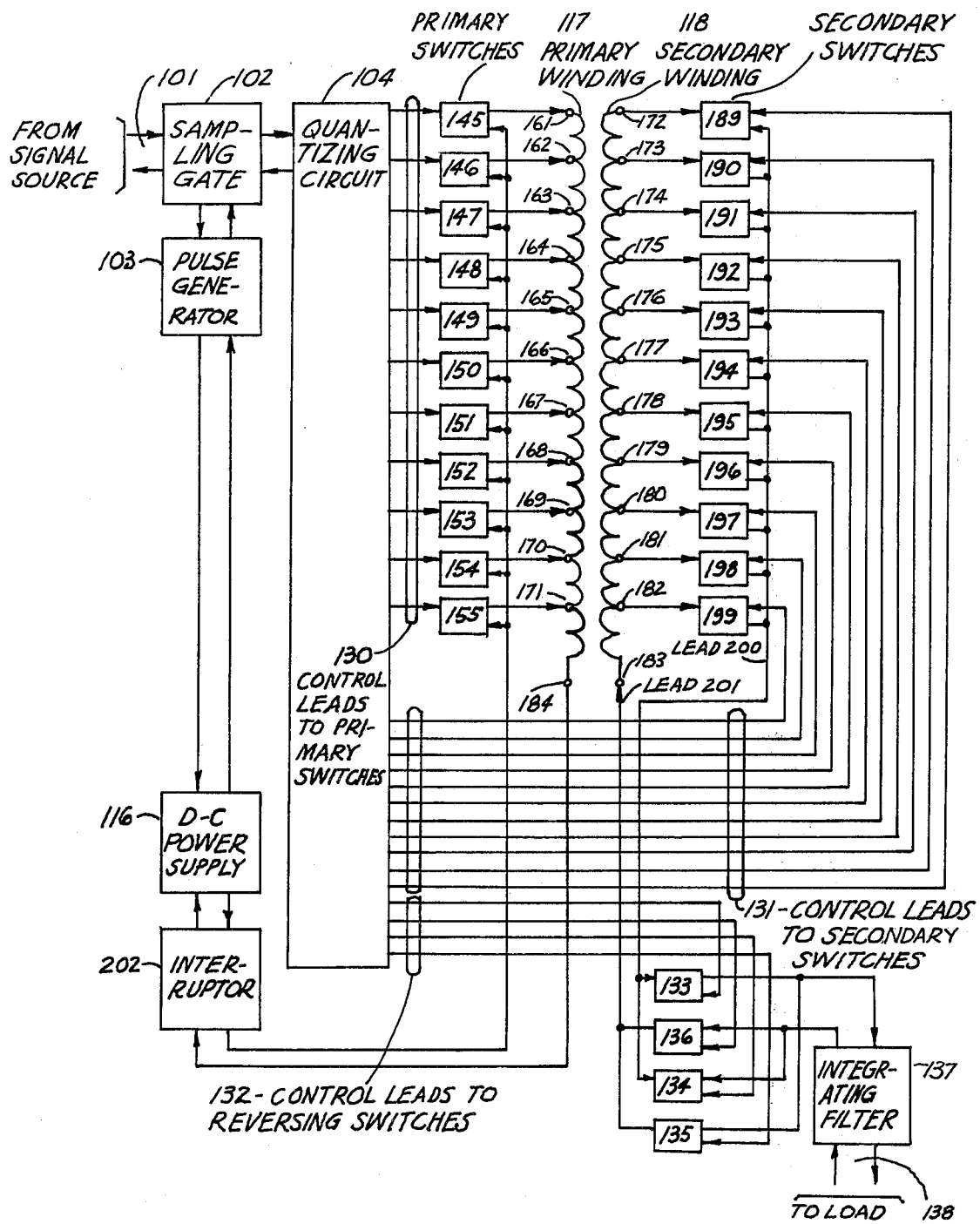

HIGH-EFFICIENCY AMPLIFIER

BRIEF DESCRIPTION AND OBJECTS OF THE INVENTION

This invention relates to a high-efficiency amplifier for power outputs from a few watts to several thousand kilowatts, using well-known techniques and apparatus. Amplifiers according to this invention may have an input-output relationship which is linear, or which follows any one of a wide range of continuous functions.

An amplifier according to this invention includes a sampling circuit, which is a device well-known to the prior art in a number of forms. The sampling theorem is given in "Reference Data for Radio Engineers," 5th Edition, New York 1968, pages 21-14 and 21-15. It states that a signal wave extending from zero to B Hz is fully defined by a sequence of amplitude samples taken at the minimum or Nyquist interval of $\frac{1}{2}B$ seconds. Thus 2B samples per second is the Nyquist rate in this case. If the signal band extends over a frequency range from nB to (n+1) B Hz the minimum or Nyquist interval varies from $\frac{1}{2}B$ to 1/2.5B second for values of n of 4 or greater. Samples of a signal extending from zero to B Hz may be reconstructed to produce a wave of identical waveform, by a low-pass filter with a cut-off frequency greater than B Hz and less than any of the combinations of the sampling frequency with the components of the signal wave. A signal wave extending from nB to (n+1)B Hz may be reconstructed from a sequence of samples by a band-pass filter with bandwidth greater than B Hz centered approximately on $(n+\frac{1}{2})B$ Hz, and less than the frequency between the spurious frequencies below nB and above (n+1)B Hz, generated by combinations of the sampling and signal frequencies.

In an amplifier according to this invention the sequence of samples of the signal wave, spaced at the Nyquist interval or less, are quantized, that is assigned to the closest of a number of predetermined amplitudes. The quantizer is a device widely used in PCM (pulse code modulation) and similar systems. An explanation of the action of a quantizer is given in "Reference Data for Radio Engineers", 5th edition, New York 1969, pages 21-19 to 21-21 inclusive.

In this invention each sample is compared in turn in the quantizer with a number of predetermined amplitudes, and is assigned to the nearest predetermined amplitude, and causes a switching pulse to appear on one or more output leads associated with that predetermined amplitude. Each switching lead is connected to a suitable low-resistance switch, such as a silicon controlled rectifier, which causes an amount of power to flow from an external d-c power source to the amplifier output, proportional to the amplitude of the selected predetermined level associated with the said suitable switch. A low-pass or band-pass filter is then utilized to reconstruct a wave-form at the amplifier output closely proportional to the original signal wave-form. If instantaneous compression or expansion of the signal wave is required, the power of the pulse from the switching elements driven to the conducting condition by the output circuits of the quantizer bears the desired relationship to the quantized signal amplitude associated with that pulse.

Switching elements have a conducting impedance much lower than the associated load impedance, and a non-conducting impedance much higher than the associated load impedance. Thus losses are relatively low in the switching elements, and a high-efficiency amplifier results.

An object of the invention is to provide a high-power amplifier which converts d-c power from an external source to signal power, with high efficiency. Another object is to provide a high-power high-efficiency amplifier using state-of-the-art components. An additional object is to provide a high-efficiency high-power amplifier with a linear or other predetermined input-output relationship.

BACKGROUND OF INVENTION

High-power high-efficiency amplifiers are used to amplify the speech and music frequencies in loud-speaker systems and as high-level modulators for radio transmitters. Such amplifiers are also used as modulated-wave amplifiers in radio transmitters for bandwidths from one Hz to 10 kHz or more at frequencies from less than 100 Hz to several hundred mHz, and in other applications.

Current practice is to use linear class B amplifiers for these applications, with each half of the class B power stage having a continuous linear input-output relationship for a half cycle of one polarity. Such amplifiers are well known to the art and are fully described in "Reference Data for Radio Engineers", 5th edition, New York 1969, pages 17-1 to 17-8 inclusive.

Other types of linear amplifiers have been used, such as the Doherty amplifier described in Terman, "Radio Engineers Handbook", New York 1943, pages 455 to 458 inclusive.

An amplifier using a combination of stepped switched functions was described by C. B. Fisher in U.S. Pat. No. 2,379,513 issued 3 July, 1945.

A linear class B amplifier has an average efficiency of conversion of direct-current power to alternating-current signal power of about 50%. The Doherty and Fisher amplifiers referenced above have somewhat better efficiency, but have practical difficulties that have limited their use in the field.

LIST OF DRAWINGS

This invention is better understood by reference to the following drawing:

The drawing shows in block-schematic form an amplifier according to this invention using a single direct-current external power source of a single voltage, with switching elements arranged to give 0.5 dB steps over a range of ±55dB.

DESCRIPTION OF THE INVENTION

The drawing shows a block-schematic circuit diagram of an amplifier according to the invention. A signal wave to be amplified enters at leads 101, and passes to a signal gate 102 driven by pulse generator 103 which drives the gate open with pulses at a rate of at least the Nyquist rate for the signal. The samples of the signal wave that appear at the output of gate 102 are led to a quantizing circuit 104, where the individual sample amplitudes are compared with a set of predetermined amplitudes. A first group 130 of switching control leads are taken from quantizer 104. Each lead corresponds to one predetermined signal amplitude and is actuated by a voltage pulse from quantizer 04 as the predetermined amplitude corresponding to that lead is approximately equalled by a signal sample.

The first set of control leads 130 from the quantizer 104 are individually connected to the control terminals of switching circuits 145 to 155 inclusive. These switching circuits have their output terminals individually connected to a set of terminals individually numbered 161 to 171 inclusive on the primary winding 117 of an output transformer. The input terminals of switching circuits 145 to 155 inclusive are each connected to one output lead of interruptor 202 driven by pulse generator 103, and thence to d-c power supply 116. The second output lead of interruptor 202 is connected to terminal 184 of primary winding 117.

A second group 131 of switching control leads are taken from quantizer 104 to the individual control terminals of secondary switching elements numbered 189 to 199 inclusive. Each switching element 189 to 199 inclusive is connected to a terminal on the secondary winding 118 of the output transformer, terminals being numbered 172 to 182 inclusive.

number of different predetermined values of voltage up to 10 volts on each side of zero. In the example given below herein the example is chosen to have 110 steps of 0.5dB on each side of zero. This means that the set, series, group or sequence (these words are used interchangeably herein) of predetermined amplitudes consists of 222 values, since zero is a natural addition to the set of predetermined amplitudes. Since the decibel is a logarithmic unit and is therefore the same as a geometric unit, each fixed point on the voltage divider referred to above, which differs by 0.5dB from the adjacent points, has a voltage with a ratio of 1.059 to the voltage at the next lower-voltage point. Using the example above of a range of voltages of the samples of the signal wave, from +10 to −10 volts, the set of voltages of predetermined value from the voltage divider is as follows:

| POINT ON VOLTAGE DIVIDER | dB BELOW MAXIMUM VALUE | PREDETERMINED POSITIVE VOLTAGE | POINT ON VOLTAGE DIVIDER | dB BELOW MAXIMUM VALUE | PREDETERMINED NEGATIVE VOLTAGE |
|---|---|---|---|---|---|
| 1 | 0.0 | 10.000 | 110 | infinity | 0.000 |
| 2 | 0.5 | 9.441 | — | — | — |
| 3 | 1.0 | 8.913 | — | — | — |
| 4 | 1.5 | 8.414 | 202 | 10.0 | 3.162 |
| 5 | 2.0 | 7.943 | 203 | 9.5 | 3.350 |
| 6 | 2.5 | 7.499 | 204 | 9.0 | 3.548 |
|   |     |       | 205 | 8.5 | 3.758 |
| 7 | 3.0 | 7.079 | 206 | 8.0 | 3.981 |
| 8 | 3.5 | 6.683 | 207 | 7.5 | 4.217 |
| 9 | 4.0 | 6.310 | 208 | 7.0 | 4.467 |
| 10 | 4.5 | 5.957 | 209 | 6.5 | 4.732 |
| 11 | 5.0 | 5.623 | 210 | 6.0 | 5.012 |
| 12 | 5.5 | 5.309 | 211 | 5.5 | 5.309 |
| 13 | 6.0 | 5.012 | 212 | 5.0 | 5.623 |
| 14 | 6.5 | 4.732 | 213 | 4.5 | 5.957 |
| 15 | 7.0 | 4.467 | 214 | 4.0 | 6.310 |
| 16 | 7.5 | 4.217 | 215 | 3.5 | 6.683 |
| 17 | 8.0 | 3.981 | 216 | 3.0 | 7.079 |
| 18 | 8.5 | 3.758 | 217 | 2.5 | 7.499 |
| 19 | 9.0 | 3.548 | 218 | 2.0 | 7.943 |
| 20 | 9.5 | 3.350 | 219 | 1.5 | 8.414 |
| 21 | 10.0 | 3.162 | 220 | 1.0 | 8.913 |
| — | — | — | 221 | 0.5 | 9.441 |
| — | — | — | 222 | 0.0 | 10.000 |

The output terminals of all switching elements 189 to 199 inclusive are connected to switching lead 200, which together with lead 201 from the end terminal 183 of the output winding, connects to the input terminals of a group of four switching elements 133, 134, 135 and 136, connected in a lattice configuration, which together form a reversing switch, controlled by a third group 132 of control leads from quantizer 104. That is, when switching elements 133 and 136 are conducting and 134 and 135 are nonconducting, the transformer output is not reversed, but when switching elements 134 and 135 are conducting and 133 and 136 are nonconducting, the transformer output is reversed in polarity.

The output of the reversing group of switching elements connects to an integrating filter 137, and this in turn has output leads 138. That is, the quantizing circuit has a set of predetermined voltages, for example the set of voltages at a plurality of fixed points on a resistive voltage divider, not shown in FIG. 1, connected from a fixed negative to a fixed positive voltage. The extreme positive and negative voltages must be at least as great as the greatest positive and negative values reached by the samples of the signal wave, which are to be quantized. Thus if the signal wave has possible maximum values of ±10 volts, the samples to be quantized may vary from −10 volts to zero, and from zero to +10 volts. The quantizer is constructed to have a definite The comparison circuit of the quantizer compares the amplitude of each sample of the signal wave, with the set of predetermined amplitudes at logarithmic intervals, from the voltage divider. Each sample amplitude must lie within 0.25dB of one of the predetermined amplitudes. This near-coincidence activates a circuit, not shown in FIG. 1, which is associated with each point of predetermined amplitude on the voltage divider. This associated circuit applies voltage to one control lead in each set of control leads, such sets being numbered 130, 131 and 132. For example, if the amplitude of the sample being quantized is +4.475 volts, the circuit associated with point 15 on the voltage divider has a voltage applied to it, which is within 0.25 dB of the predetermined amplitude at point 15 of +4.467 volts, corresponding to 7.0dB below the maximum positive value of the signal wave. The circuit associated with point 15 then applies switching potential to the control leads leading to reversing switches 133 and 136. These leads are connected together in the quantizing circuit, as switches 133 and 136 are always operated together. Similarly the control leads to reversing switches 134 and 135 are connected together. The operation of switches 133 and 136 indicates that the quantized signal wave sample has a positive amplitude, and hence the transformer output is not reversed by the reversing switches. The circuit associated with point 15 on the voltage divider also applies switching potential to the control lead to primary switch 151, which connects transformer primary tap 167 to the power supply. As shown in the first table below herein, this results in a reduction of 2.0 dB from the maximum output voltage. The associated circuit of point 15 on the voltage divider also applies switching potential to the control lead to secondary switch 190, which connects transformer secondary tap 173 to the circuits leading to the load circuit. As shown in the second table below herein, this results in a reduction of 5.0 dB in the output voltage from the maximum value. Thus the total result of the activation of the circuit associated with point 15 of the voltage divider, in response to a sample of the signal wave with a positive amplitude of 4.467 volts, which is 6.98 dB below the maximum positive amplitude of 10 volts, is to cause a positive pulse to appear at the load circuit, reduced from the maximum value by 2.0dB by the closing of primary switch 151, and a further 5.0dB by the closing of secondary switch 190, for a total reduction of 7.0dB from the maximum value. The voltage divider and its associated circuits compare a set of predetermined amplitudes, set up on the voltage divider, which are in a geometric series, that is to say a logarithmic sequence, with the amplitude of each sample of the signal wave in turn, and upon a near-coincidence activate three selected output leads. This is a well-known arrangement which is used directly, or in an equivalent form, in quantizing circuits of the prior art. Hence herein we show no detailed drawings of such circuits and make no claims regarding them.

In order to explain more clearly the operation of the drawing, we will assign a first set of values to the elements and currents in the apparatus of the drawing, as no generality is lost thereby.

The signal appearing at input leads 101 is designated as a speech or music wave in the frequency range 70 to 7000 Hz, with no zero-frequency component, and with approximately equal positive and negative peak values. The peak value is to be divided into 110 equal geometric steps on each side of zero. Each step may be made 0.5dB, for a range of ±55dB. This result is obtained by designing the primary winding 117 to have turns ratios between terminals, relative to the number of turns between terminals 171 and 184, as shown in the following table. These turns ratios have here been converted to dB by the equation:

$$\text{number of dB} = 20 \log_{10} \times (\text{turns ratio})$$

| TERMINAL NUMBERS | TURNS RATIO TO WINDING 171-184 | TURNS RATIO IN dB |
|---|---|---|
| 171-184 | 1.000 | 0.0 |
| 170-184 | 1.059 | 0.5 |
| 169-184 | 1.122 | 1.0 |
| 168-184 | 1.188 | 1.5 |
| 167-184 | 1.259 | 2.0 |
| 166-184 | 1.334 | 2.5 |
| 165-184 | 1.413 | 3.0 |
| 164-184 | 1.496 | 3.5 |
| 163-184 | 1.585 | 4.0 |
| 162-184 | 1.679 | 4.5 |
| 161-184 | 1.778 | 5.0 |

The secondary winding 118 is designed with turns ratios between terminals, relative to the number of turns between terminals 182 and 183, as shown in the following table, where the equivalent number of dB are also shown for each ratio.

| TERMINAL NUMBERS | TURNS RATIO TO WINDINGS 182-183 | TURNS RATIO IN dB |
|---|---|---|
| 182-183 | 1.000 | 0 |
| 181-183 | 1.778 | 5 |
| 180-183 | 3.162 | 10 |
| 179-183 | 5.623 | 15 |
| 178-183 | 10.00 | 20 |
| 177-183 | 17.78 | 25 |
| 176-183 | 31.62 | 30 |
| 175-183 | 56.23 | 35 |
| 174-183 | 100.0 | 40 |
| 173-183 | 177.8 | 45 |
| 172-183 | 316.2 | 50 |

If we designate the lowest output as reference level or 0dB, this is achieved with the entire primary winding 117 functioning, that is only switching element 145 conducting, and the smallest portion of the secondary winding 118 functioning, that is only switching element 199 conducting. The level increases in steps of 0.5dB to +5.0 dB as conducting elements 146 to 155 on the primary side each separately become conducting, and only switching element 199 is conducting on the secondary side. An increase in level of 5.0 dB in 0.5 dB steps is obtained by operating each primary switching element in turn, as before, while each secondary switching element is operated in turn, which results in a level change of 50 dB in 5dB steps, as each secondary switching element is also operated in sequence. In this way a full range of 110 steps or 55 dB is encompassed. By operation of the group of reversing switches a negative range is also covered.

Obviously the primary and secondary steps can be selected for other than ratios of 0.5dB and 5dB, depending on the particular application of the amplifier according to the invention. It may also be desirable to use different number of steps from the numbers of primary steps and secondary steps here chosen. Similarly, small steps may be used on the secondary side, and large steps on the primary side, depending on the application. None of these variations departs from the present invention.

The output from transformer winding 118 passes through a reversing group of switching elements as already described, and then to the integrating filter 137. The purpose of filter 137 is to reconstruct the waveform of the signal from the sequence of samples from gate 102, in accordance with the sampling theorem, and to stop the sampling frequency from reaching output leads 138.

On the first assumption made above of a speech or music wave with a band of 70 to 7,000 Hz, the sampling gate must operate above the Nyquist rate, say at 2.5×7,000 or 17,500 samples per second. Each sample will then have a maximum length of 1/17,500 or about 57 microseconds. The transformer with windings 117 & 118 passes these pulses without appreciable distortion, and hence has a wide frequency range. Filter 137 freely passes the signal band 70 to 7,000 Hz, and stops the sampling frequency 17,500 Hz and preferably other parts of the spectrum.

In order fully to explain the invention, we make a second assumption that the signal wave at leads 101 consists of a carrier wave of 1000 kHz, amplitude modulated on a double-sideband basis by a speech and music wave extending from 70 to 7,000 Hz. The signal band then extends from 993 to 1007 kHz, the signal bandwidth is 14 kHz, and the sampling rate becomes about 35,000 samples per second. Transformer windings 117 and 118 pass these samples without material loss or distortion, and integrating filter 137 freely passes the signal band 993 to 1007 kHz and stops the sampling frequency.

In order to achieve high efficiency, each switching element of the drawing must have a conducting resistance much lower than, and a nonconducting impedance much higher than, the impedance of the circuit in which it is connected. Similarly, the losses in the transformer with windings 117 and 118 must be small compared to the maximum amount of power it is required to transform.

Other variations of the drawing are also covered by this invention. Windings 117 and 118 may be interchanged in place and the control leads suitably rearranged. The reversing group of switches 133, 134, 135 and 136 may be placed between d-c power supply 116 and winding 117, instead of between winding 118 and filter 137.

Switching elements may be used which continue to conduct, after application and subsequent withdrawal of a control potential, as is the case with many types of suitable devices. In this case the output of d-c power supply 116 is passed through interruptor 202, which receives pulses from pulse generator 103. Such an interruptor circuit is a well-known device, and functions to interrupt the dc and causes all switching elements which are conducting to change to nonconducting, in readiness for the next pulse to be received over control lead groups 130, 131 and 132.

What we claim is:

1. A method of amplifying a signal wave which comprises:

Sampling said signal wave at a rate of twice the bandwidth in herz of said signal wave or faster, and comparing the amplitude of each sample so obtained to the amplitudes of a group of predetermined amplitudes, and quantizing said sample amplitudes by a quantizing circuit of a type commonly used in pulse code modulated systems, said predetermined amplitudes being spaced at equal geometric ratios of not more than one decibel over the total amplitude range of said signal wave, and causing said quantizing circuit to apply a potential to a combination of three or more leads of a plurality of switching control leads, for each of said signal amplitudes closest to one of said predetermined amplitudes, each said combination of said control leads being different for each different value of said predetermined amplitudes, and applying said potentials applied to said combination of control leads selectively to a plurality of switching means, some of which are interposed between a direct-current power supply and a transformer with a winding or windings tapped in sequences of geometric ratios, and some of which are interposed between said transformer and an integrating means, causing said switching means to operate causing current pulses to flow in said transformer winding or windings, so that each resulting output pulse from said transformer is the same in polarity and related in amplitude, to the corresponding signal wave sample delivered to said amplitude-comparison and quantizing circuits, and applying the sequence of said output pulses from said transformer to said integrating means which freely passes the signal frequency band, to produce an amplified replica of said signal wave, and applying the amplified wave from said integrating means to a load circuit.

2. Apparatus for amplifying a signal wave, comprising:

means for sampling said signal wave at a rate of twice the bandwidth of said signal wave in herz or greater, including a sampling gate driven by a source of regularly-occurring pulses, and means for comparing and quantizing the amplitude of each sample of said signal wave with reference to a sequence of predetermined amplitudes, which form a geometric progression, and means, associated with said comparing and quantizing means, for applying a potential to a selected combination of leads of a plurality of control leads, for each of said signal samples, the selected combination of control leads being different for each of said predetermined amplitudes, that combination being selected for the predetermined amplitude closest to the amplitude and polarity of each said signal sample, and a plurality of switching means, each being controlled by one of said control leads, some of said plurality of switching means being interposed between a direct-current power supply and a transformer with a winding or windings tapped in geometric ratios, and some of said switching means being interposed between said transformer and integrating means, and said integrating means, comprising filter means, functioning to integrate said pulses at said transformer output to produce an amplified replica of said input signal wave, and a load circuit connected to the output of said integrating means.

* * * * *

UNITED STATES PATENT AND TRADEMARK OFFICE
CERTIFICATE OF CORRECTION

PATENT NO. : 4,153,882
DATED : May 8, 1979
INVENTOR(S) : Sidney T. Fisher et al.

It is certified that error appears in the above-identified patent and that said Letters Patent are hereby corrected as shown below:

Column 1, line 16, "1968" should read -- 1969 --.

Column 2, line 19, "mHz" should read -- MHz --.

Column 2, line 64, "04" should read -- 104 --.

Signed and Sealed this

Eighteenth Day of September 1979

[SEAL]

Attest:

LUTRELLE F. PARKER

*Attesting Officer*  *Acting Commissioner of Patents and Trademarks*